US012205020B2

(12) United States Patent
Dalgaty et al.

(10) Patent No.: US 12,205,020 B2
(45) Date of Patent: Jan. 21, 2025

(54) BAYESIAN NEURAL NETWORK WITH RESISTIVE MEMORY HARDWARE ACCELERATOR AND METHOD FOR PROGRAMMING THE SAME

(71) Applicant: COMMISSARIAT A L'ENERGIE ATOMIQUE ET AUX ENERGIES ALTERNATIVES, Paris (FR)

(72) Inventors: Thomas Dalgaty, Grenoble (FR); Niccolo Castellani, Grenoble (FR); Elisa Vianello, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 960 days.

(21) Appl. No.: 17/224,696

(22) Filed: Apr. 7, 2021

(65) Prior Publication Data

US 2021/0350218 A1    Nov. 11, 2021

(30) Foreign Application Priority Data

May 6, 2020   (EP) ...................................... 20305450

(51) Int. Cl.
*G06N 3/065*   (2023.01)
*G06N 3/047*   (2023.01)
(Continued)

(52) U.S. Cl.
CPC ............. *G06N 3/065* (2023.01); *G06N 3/047* (2023.01); *G06N 3/08* (2013.01); *G11C 13/0021* (2013.01)

(58) Field of Classification Search
CPC .......... G06N 3/065; G06N 3/047; G06N 3/08; G11C 13/0021
See application file for complete search history.

(56) References Cited

U.S. PATENT DOCUMENTS

2017/0140819 A1*   5/2017   Lee ..................... G11C 13/0069

FOREIGN PATENT DOCUMENTS

CN         110956256 A       4/2020

OTHER PUBLICATIONS

Lin et al., "Bayesian Neural Network Realization by Exploiting Inherent Stochastic Characteristics of Analog RRAM," 2019 IEEE International Electron Devices Meeting (IEDM), San Francisco, CA, USA, 2019, pp. 14.6.1-14.6.4 (Year: 2019).*

(Continued)

*Primary Examiner* — Shane D Woolwine
*Assistant Examiner* — Yao David Huang
(74) *Attorney, Agent, or Firm* — Oblon, McClelland, Maier & Neustadt, L.L.P.

(57) ABSTRACT

A Bayesian neural network including an input layer, and, an output layer, and, possibly, one or more hidden layer(s). Each neuron of a layer is connected at its input with a plurality of synapses, the synapses of the plurality being implemented as a RRAM array constituted of cells, each column of the array being associated with a synapse and each row of the array being associated with an instance of the set of synaptic coefficients, the cells of a row of the RRAM being programmed during a SET operation with respective programming current intensities, the programming intensity of a cell being derived from the median value of a Gaussian component obtained by GMM decomposition into Gaussian components of the marginal posterior probability of the corresponding synaptic coefficient, once the BNN model has been trained on a training dataset.

12 Claims, 10 Drawing Sheets

(51) Int. Cl.
   *G06N 3/08*   (2023.01)
   *G11C 13/00*  (2006.01)

(56) References Cited

OTHER PUBLICATIONS

Myshkov et al., "Posterior distribution analysis for Bayesian inference in neural networks," Workshop on Bayesian Deep Learning, NIPS 2016, Barcelona, Spain (Year: 2016).*

Liu et al., "A Unified Framework for Training, Mapping and Simulation of ReRAM-Based Convolutional Neural Network Acceleration," in IEEE Computer Architecture Letters, vol. 18, No. 1, pp. 63-66, Jan. 1-Jun. 2019 (Year: 2019).*

Malhotra, et al. "Exploiting Oxide Based Resistive RAM Variability for Bayesian Neural Network Hardware Design," in IEEE Transactions on Nanotechnology, vol. 19, pp. 328-331, 2020 (Year: 2020).*

Wu et al., "ReRAM Crossbar-based Analog Computing Architecture for Naive Bayesian Engine," 2019 IEEE 37th International Conference on Computer Design (ICCD) (Year: 2019).*

European Search Report issued Nov. 6, 2020 in European Application 20305450.7 filed on May 6, 2020, 16 pages (with Written Opinion).

Dalgaty et al., "In-situ learning harnessing intrinsic resistive memory variability through Markov Chain Monte Carlo Sampling", arXiv:2001.11426v1 [cs.ET] Jan. 30, 2020.

Chauveau et al., "ECM and MM algorithms for normal mixtures with constrained parameters", Sep. 18, 2013, XP055738098, https://hal.archives-ouvertes.fr/hal-00625285y2/document, 19 pages.

Markovic et al., "Physics for Neuromorphic Computing", ARXIV.org, Mar. 8, 2020, XP081618454, 32 pages.

Cai et al., "VIBNN: Hardware Acceleration of Bayesian Neural Networks", ACM SIPGLAN Notices, vol. 53, issued 2, Mar. 2018, 13 pages.

Liao et al., "Weighted Synapses Without Carry Operations for RRAM-Based Neuromorphic Systems", Frontiers in Neuroscience, vol. 12, Mar. 16, 2018, 9 pages.

Hoffman et al., "The No-U-Turn Sampler: Adaptively Setting Path Lengths in Hamiltonian Monte Carlo", Journal of Machine Learning Research, 15, 2014, pp. 1593-1623.

Carboni et al., "Stochastic Memory Devices for Security and Computing", Advanced Electronic Materials, 5, 1900198, 2019, 27 pages.

Kucukelbir et al., "Automatic Differentiation Variational Inference", Journal of Machine Learning Research, No. 18, 2017, 45 pages.

Blundell et al., "Weight Uncertainty in Neural Networks", Proceedings of the $32^{nd}$ International Conference on Machine Learning, JMLR: W& CP vol. 37, 2015, 10 pages.

U.S. Appl. No. 16/950,156, filed Nov. 17, 2020, Dalgaty, T, et al.

* cited by examiner

BAYESIAN NEURAL NETWORK WITH RESISTIVE MEMORY HARDWARE ACCELERATOR AND METHOD FOR PROGRAMMING THE SAME

FIELD OF THE INVENTION

The present invention concerns the field of machine learning (ML) and more specifically Bayesian neural networks (BNNs). It also relates to the field of resistive Random Access Memories (RRAMs).

Background of the Invention

With the development and applications of deep learning algorithms, artificial neural networks (ANNs), hereinafter simply referred to as neural networks, have achieved tremendous success in various fields such as image classification, object recognition, natural language processing, autonomous driving, cancer detection, etc.

However conventional neural networks are prone to overfitting, that is to situations where the network model fail to generalize well from the training data to new data. The underlying reason for this shortcoming is that the ANN model parameters, i.e. the synaptic coefficients (or weights), do not capture the uncertainty of modelling, namely the uncertainty about which values of these parameters will be good at predicting or classifying new data. This particularly true when using scarce or noisy training data. Conversely, reliable ANN model parameters require huge amount of training data.

To capture modelling uncertainty a probabilistic programming approach can be adopted. That is, in contrast to traditional ANNs whose weights are fixed values, each weight is a random variable following a posterior probability distribution, conditioned on a prior probability distribution and the observed data, according to Bayes rule. Such neural networks are called Bayesian neural networks (BNNs). BNNs can learn from small datasets, achieve higher accuracy and are robust to overfitting.

From a practical point of view, BNN can be regarded as an ensemble of neural networks (NNs) whose respective weights have been sampled from the posterior probability distribution p(w|D), where w is the flattened vector conventionally representing all weights of the network (i.e. all weights of the network are arranged consecutively in vector w) and D is the training dataset. The training dataset is comprised of data $x^{(i)}$ and their corresponding labels $z^{(i)}$, i=1, ..., S. For classification, $z^{(i)}$ is a set of classes and, for regression, a value of a continuous variable.

After the BNN has been trained, it can be used (for prediction or classification) on new data. More specifically, if we denote $x_0$ the vector input representing new data, the output of the BNN is obtained by averaging the output of NNs sampled according to the posterior probability distribution:

$$z = E_{p(w|D)}[f(x_0, w)] \quad (1)$$

where $f$ denotes the network function and $E_{p(w|D)}$ denotes the expectation according to the posterior probability distribution of the weights, p(w|D).

The posterior probability distribution can be calculated according to Bayes rule as:

$$p(w|D) = \frac{p(D|w)p(w)}{p(D)} \quad (2)$$

where $p(1)) = \int p(1)|w)p(w)dw$.

The calculation of the latter integral is generally intractable and therefore different techniques have been proposed in the prior art in order to approximate the posterior probability distribution, p(w|D), like Markov Chain Monte Carlo (MCMC) sampling or variational inference.

The training of a BNN requires substantial processing and storage resources which are unavailable in most implementation platforms such as IoT devices or even edge computing nodes. A known solution is to shift the computation burden to the Cloud and train the BNN ex situ. The resulting parameters of the weight probability distribution are then transferred to the inference engine located in the implementation platform.

The inference engine nevertheless needs to sample the weights of the BNN according to the posterior probability distribution p(w|D) and perform the calculation of network function $f$ for each sample, before output averaging. However, calculation of the network function entails intensive dot product computation.

Various hardware accelerators have been proposed for generating samples according to a Gaussian distribution law and for performing dot product calculation.

For example, the article of R. Cai et al. entitled "VIBNN: hardware acceleration of Bayesian neural networks" published in ACM SIGPLAN Notices, Vol. 53, Issue 2, March 2018 discloses an FGPA based accelerator for variational inference on BNNs.

However, the proposed accelerator only allows for the generation of a Gaussian posterior probability distribution for the synaptic coefficients (or weights). In other terms, BNNs whose weights follow an arbitrary probability distribution after training cannot benefit from such a hardware accelerator. Furthermore, the proposed VIBNN architecture requires volatile memories and to move data at high rate between these memories and random generator units.

On the other hand, non-volatile resistive memories (RRAMs) have been used for dot product computation in the training and the predicting phases. In such a memory, the dot product between an input voltage vector and an array of conductance values stored in the RRAM is obtained as a sum of currents according to Kirchhoff's circuit law. An example of use of RRAMs for dot product computation in a neural network can be found in the article of Y. Liao et al. entitled "Weighted synapses without carry operations for RRAM-based neuromorphic systems" published in Front. Neuroscience, 16 Mar. 2018.

However, RRAMs generally suffer from device-to-device dispersion and cycle-to-cycle conductance dispersion which are mitigated in order to ensure reliable training and prediction. These mitigation techniques imply area, time and energy consumption.

An object of the present invention is therefore to propose a Bayesian neural network equipped with an efficient hardware accelerator capable of modeling arbitrary posterior probability distributions of the synaptic coefficients. A further object of the present invention is to propose a method for programming such a Bayesian neural network.

BRIEF DESCRIPTION OF THE INVENTION

The present invention is defined by the appended independent claims. Various preferred embodiments are defined in the dependent claims.

BRIEF DESCRIPTION OF THE DRAWINGS

The present invention will be better understood from the description of the following embodiments, by way of illustration and in no way limitative thereto.

DETAILED DISCLOSURE OF PARTICULAR EMBODIMENTS

Figure 1:
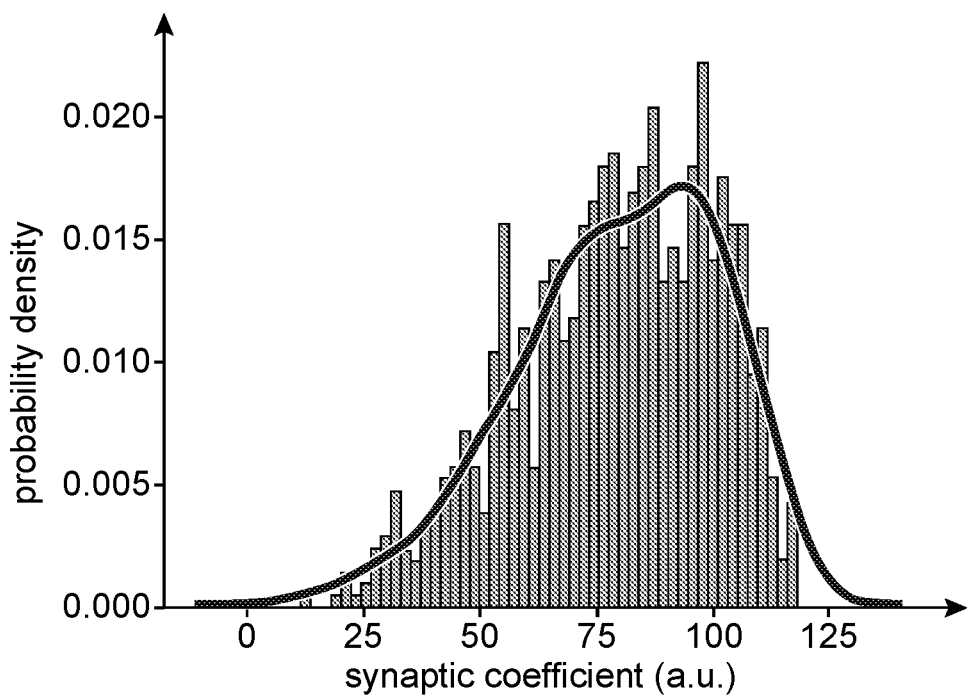
FIG. 1 schematically illustrates an example of probability distribution of a synaptic coefficient in a Bayesian neural network.

We are considering in the following a Bayesian neural network (BNN) as introduced in description of the prior art.

After it has been trained, a BNN is associated with a joint posterior probability distribution $p(w|D)$, where D is the training dataset. In the following, we will use the vector notation w when referring to the whole set of synapses and to the scalar notation w when referring to a single synapse. The training dataset is denoted D $$D = \{x^{(i)}, z^{(i)}\}$$

where $x^{(i)}$ is the input data on which the neural network is to be trained and $z^{(i)}$ or $z^{(i)}$ if the output is scalar) the corresponding labels.

The training is preferably performed ex situ on a model of the neural network, that is outside the hardware BNN itself, for example in the Cloud on a distant server.

Given the training dataset $D=\{x^{(i)},z^{(i)}\}$, the likelihood function $p(D|w)$ can be calculated by:

$$p(D|w) = \prod_i p(z^{(i)}|x^{(i)}, w) \quad (3)$$

The prior distribution of the synaptic coefficients p(w) can be chosen (multivariate) Gaussian and the numerator of expression (2) can be derived therefrom $h(w; D, \Sigma)=p(D|w)p(w)$, where $\Sigma$ is a covariance matrix. Preferably, the covariance matrix will be chosen as $\Sigma=\sigma^2 I$ where $\sigma^2$ is a predetermined common variance of the prior distributions of the synaptic coefficients.

The posterior distribution $p(w|D)$ being proportional to $h(w; D, \Sigma)$, it can be obtained by a Markov Chain Monte Carlo (MCMC) method, such as, for example, the well-known Metropolis-Hastings algorithm, or, preferably, the No-U-Turn MCMC Sampling (NUTS) algorithm as described in the paper of M. D. Hoffman et al. entitled "The No-U-Turn Sampler: adaptively setting path lengths in Hamiltonian Monte Carlo" published in Journal of Machine Learning Research 15 (2014), 1593-1623.

Alternatively, the posterior distribution can be obtained by a variational inference as described further below.

A first idea at the basis of the invention is to represent the posterior marginal probability distribution function (PDF) of each synaptic coefficient $p(w|D)$ as a Gaussian mixture model (GMM). In other words, the marginal posterior probability distribution of each synaptic coefficient can be approximated by a linear combination of a plurality K of Gaussian distributions, also referred to as Gaussian components:

$$p(w|D) \square \sum_{k=1}^{K} \lambda_k g(w; \mu_k, \sigma_k^2) \quad (4)$$

where $g(\cdot; \mu_k, \sigma_k^2)$ denotes the $k^{th}$ Gaussian component, of mean $\mu_k$ and standard deviation $\sigma_k$, and where $\lambda_k$ is a weighting factor. The weighting factors satisfy the constraint $$\sum_{k=1}^{K} \lambda_k = 1.$$

As the synaptic coefficients are not independent from each other, the mean and standard deviation values $\mu_k$, $\sigma_k$; k=1, . . . , K alone fail to capture the posterior probability distribution of the whole set of synaptic coefficients $p(w|D)$. However, the covariance matrix of the synaptic coefficients will be taken into account by joint sampling as explained further below.

Several techniques are available for estimating the set of parameters $\Omega=\{\lambda_k, \mu_k, \sigma_k|k=1, \ldots, K\}$ of the GMM. Preferably, a maximum likelihood (ML) estimation will be used.

More specifically, we are looking for the model parameters which maximize the likelihood of the GMM given a sampling of the posterior probability distribution $p(w|D)$, previously obtained by MCMC, denoted $w_1, w_2, \ldots, w_J$ where J is the number of samples of said distribution.

The ML estimates of the parameters can be obtained iteratively by using the expectation-maximization (EM) algorithm.

First, the conventional EM algorithm will be set out below and next an adapted version thereof for the purpose of the present invention will be presented.

Basically, the EM algorithm starts with an initial guess of the parameters $\omega^{(0)}=\{\mu_k^{(0)}, \sigma_k^{(0)}|k=1 \ldots, K\}$ and estimates the membership probabilities of each sample, $\lambda_{k,j}^{(0)}$, that is the probability that sample $w_j$ originates from the $k^{th}$ Gaussian distribution. Then the expectation of the log likelihood $$\log L(\Omega; w) = \log\left(\sum_{k=1}^{K} \lambda_k^{(0)} g(w; \mu_k, \sigma_k^2)\right) \quad (0)$$

is calculated over the samples $w_1, w_2, \ldots, w_J$ on the basis of their respective membership probabilities and set of parameters $\Omega^{(1)}$ maximizing this expectation is derived. The parameters $\omega^{(1)} = \{\mu_k^{(1)}, \sigma_k^{(1)} | k=1, \ldots, K\}$ belonging to $\Omega^{(1)}$ are then used as new estimates for a next step. The expectation calculation and maximization steps alternate until the expectation of $\log L (\Omega; w)$ saturates, i.e. does not increase by more than a predetermined threshold in comparison with the preceding step. Alternatively, the stopping criterion can be based on Kullback-Leibler divergence between the combination of Gaussian components and the target posterior probability distribution.

The number K of Gaussian components can be determined heuristically. Alternatively, a predetermined range of values of K can be swept and the value achieving the highest expectation of log likelihood at the EM iterative process can be selected.

In fact, as earlier mentioned, the EM algorithm is not applied as such but a constrained version thereof has been developed for the present invention.

The constraint is a relationship between the mean value and the standard deviation that cannot be chosen independently in the hardware implementation of the BNN. More specifically, the standard deviation is assumed to follow a linear law, $h(\cdot)$, with respect to the mean:

$$\sigma = h(\mu) = \sigma_0 - \lambda \cdot \mu \quad (5)$$

where $\lambda$ is a positive coefficient given by the hardware implementation. Hence, the Gaussian components in (4) depend on only one parameter: $g(\cdot; \mu_k, h^2(\mu_k))$. It follows that the set of parameters is restrained to the subset $\tilde{\Omega} = \{\lambda_k, \mu_k, h(\mu_k) | k=1, \ldots, K\}$ and that the log-likelihood maximization in the EM in the algorithm is performed on this subset instead of the entire set $\Omega$. In the following, the subset of parameters will merely be defined as $\tilde{\Omega} = \{\lambda_k, \mu_k | k=1, \ldots, K\}$ since the standard deviation values of the components can be derived from their respective mean values.

Figure 2:
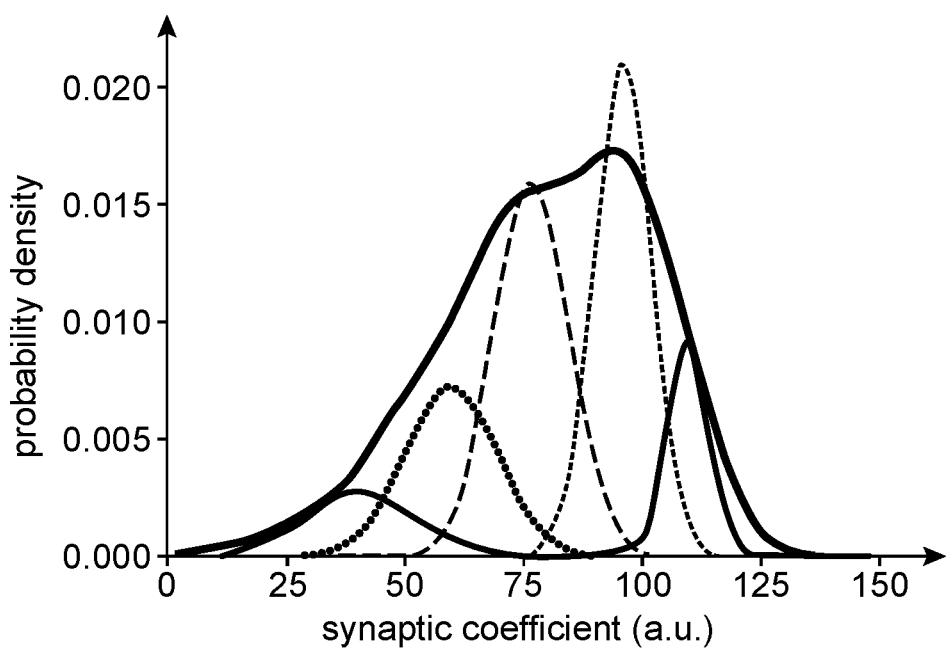
FIG. 2 shows a decomposition of the probability distribution of FIG. 1 into a mixture of Gaussian probability distributions.

FIG. 1 schematically illustrates an example of probability distribution of a synaptic coefficient in a Bayesian network and FIG. 2 shows its decomposition into Gaussian components.

The probability distribution of a synaptic coefficient, w, in FIG. 1 has been obtained by sampling the posterior $p(w|D)$.

It can be seen from FIG. 2 that this probability distribution can be considered as combination (or mixture) of five Gaussian components, each component being characterized by a mean and associated standard deviation, and by a weighting factor. It should be noted that the standard deviations of the components (linearly) decreases with their respective mean values. The weighting factor of a component reflects how much this component contributes to the target distribution, here the probability of the synaptic coefficient in question.

After GMM decomposition of posterior probability distribution of the synaptic coefficients into Gaussian components, the Bayesian neural network is defined by a set of $2K \times Q$ parameters, $$\bigcup_{q=1}^{Q} \Omega_q$$

where $\tilde{\Omega}_q = \{\lambda_{q,k}, \mu_{q,k} | k=1, \ldots, K\}$ where Q stands for the number of synapses in the BNN and q is an index of the synapses.

Once the parameters of have been calculated ex situ on a model of the BNN, e.g. by a server in the Cloud, they can be transferred to the BNN itself, that is its hardware implementation. The BNN is then programmed with these parameters before it can be used for inference, as explained further below.

A second idea at the basis of the present invention is to use a resistive switching RAM also simply called resistive memory (RRAM) as hardware accelerator for implementing the dot product performed by the synapses of the BNN.

More specifically the invention makes use of the cycle to cycle (C2C) variability of the low-resistance obtained after a SET operation in order to generate the synaptic coefficients according to their respective probability distributions parametrized by $\tilde{\Omega}_q$, $q=1, \ldots, Q$.

We recall that a resistive switching RAM consists of non-volatile random access memory cells, each cell comprising a resistor made of dielectric which can be programmed either in a low resistance state (LRS), also called high conductance state (HCS) or in a high resistance state (HRS), also called low conductance state (LCS), with a so-called RESET operation.

During a SET operation, a strong electric field is applied to the cell, while limiting the current to a programming current value. This operation forms a conductive filament through the dielectric and confers to the resistor a high conductance value, which depends upon the programming current value.

Conversely, during a RESET operation, a programming voltage is applied to the cell with the same or opposite polarity than the one used for electroforming. This voltage breaks the filament and the resistor returns therefore to a low conductance value, which depends upon the programming voltage value.

A detailed description of RRAM can be found in the article by R. Carboni et al., entitled "Stochastic memory devices for security and computing", published in Adv. Electron. Mat., 2019, 5, 1900198, pages 1-27.

Once a cell has been programmed by a SET operation, the obtained high conductance value is stable in time until the next operation is performed. However, the high conductance value varies from one SET operation to the next, even if the programming current is kept constant.

More specifically, for a given programming current, the high conductance in the HCS state can be considered as a random variable which exhibits a normal distribution over the SET operations. The mean value and the standard deviation of this normal distribution are determined by the programming current used during the SET operations.

Figure 3:
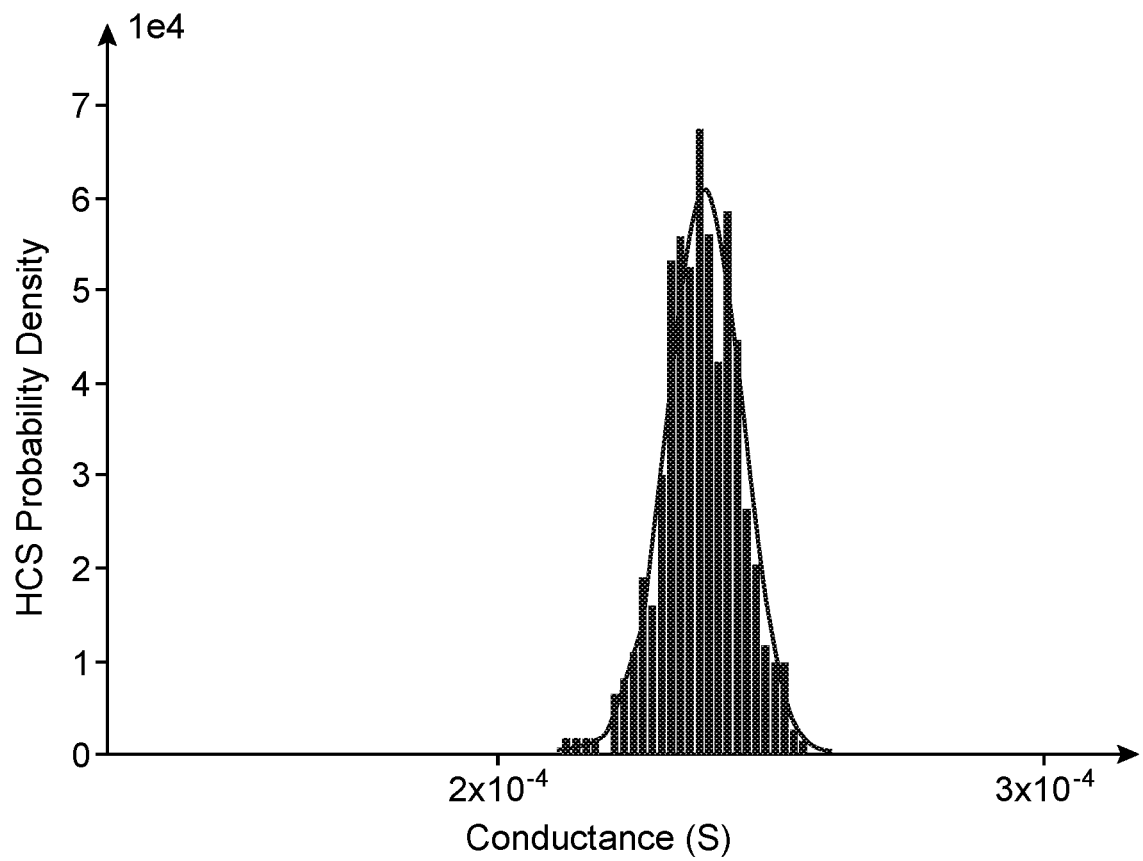
FIG. 3 shows an example of probability distribution of the conductance of a resistor in a programmed RRAM cell.

FIG. 3 shows the probability density distribution of the conductance of a RRAM cell programmed with a SET programming current.

Figure 4:
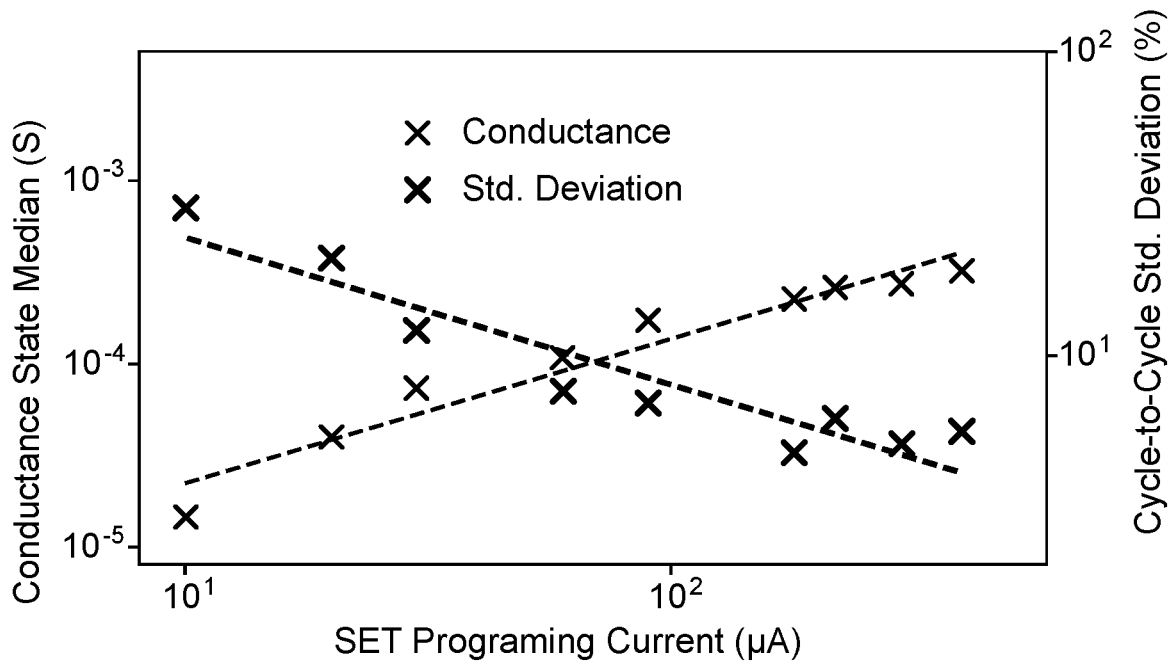
FIG. 4 illustrates the evolution of the median and the standard deviation of the conductance vs. the set programming current in a RRAM cell.

Once the RRAM cell has been programmed by a SET operation, its conductance is a sample from a normal distribution whose median value (or, equivalently, mean value since the distribution is normal) depends upon the programming current as illustrated in FIG. 4.

In FIG. 4, the x-axis indicates (in logarithmic scale) the programming current (in A) during the SET operation. The y-axis on the left indicates (in logarithmic scale) the median value (in Siemens) of the conductance of the resistor once the RRAM has been programmed, whereas the y-axis on the right indicates (in logarithmic scale) the cycle-to-cycle standard deviation (as a percentage of the median) of the conductance of the RRAM thus programmed.

The variation in log-log scale being linear, it means that the median value of the conductance, $g^{median}$, in high conductance state, follows a power law of the type $g^{median} = \alpha(I_{SET})^\gamma$ where $\alpha$ and $\gamma$ are positive coefficients and $I_{SET}$ is the intensity of the current injected in the resistor during the SET operation. Hence, in order to program a distribution having a target median value, the programming current during the SET operation needs to be:

$$I_{SET} = \left(\frac{g^{median}}{\alpha}\right)^{1/\gamma} \qquad (6)$$

The evolution of the standard deviation (in Siemens) vs. the median value of the conductance can be approximated by a linear function of the type $\sigma = \sigma_0 - \lambda g^{median}$ where $\sigma_0$ is a constant and $\lambda$ is a positive coefficient.

Figure 5A:
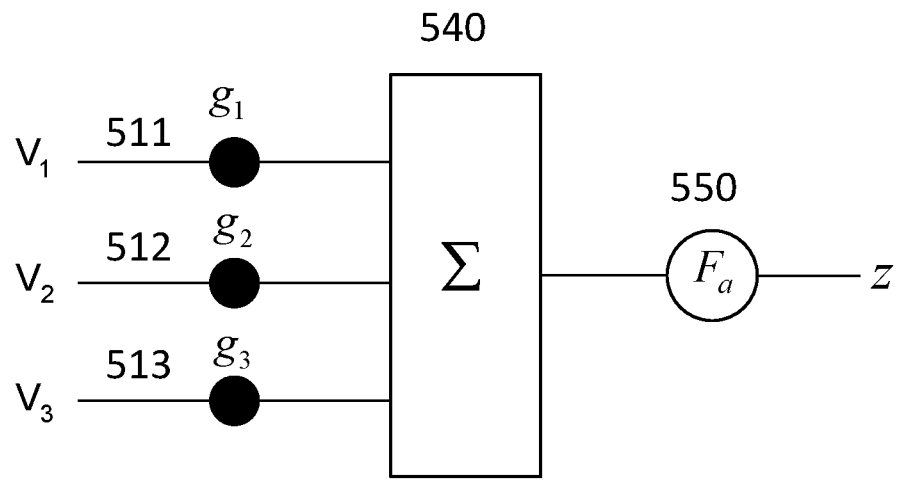
FIGS. 5A and 5B schematically illustrate a first variant of a neuron fed with synapses, which can be used in a BNN according the present invention.
Figure 5B:
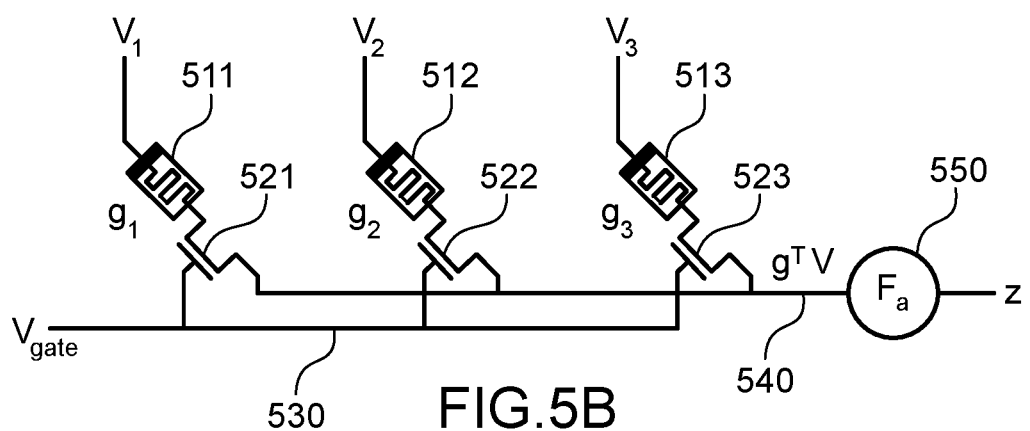

FIG. 5A symbolically represents a first variant of a neuron fed with three synapses and FIG. 5B their corresponding implementation in a RRAM memory.

FIG. 5A shows three synapses 511, 512, 513 of respective coefficients $g_1, g_2, g_3$ whose outputs are summed in adder 540 for feeding neuron 550.

In FIG. 5B, the three synapses are embodied by RRAM cells connected to a common data line, 540, feeding neuron 550.

Each cell comprises a programmable resistor (511,512, 513) in series with a FET transistor (521,522,23), the gates of the FET transistors being connected to a control line 530 driven by the voltage $V_{gate}$ and the drains of the FET transistor being connected to the data line. If we denote $g_1, g_2, g_3$ the conductance values of the respective resistors (the values stored in the cell) and $V_1, V_2, V_3$ the voltages applied at the resistors, the current flowing through the data line is simply the dot product $g^T V$ where $V^T = (V_1\ V_2\ V_3)$ is the input vector and $g^T = (g_1\ g_2\ g_3)$ is the vector of the synaptic coefficients related to neuron 550. Neuron 550 applies an activation function, $F_a$, for example a logistic function, to the dot product $g^T V$, to output the value:

$$z = F_a(g^T V) \qquad (7)$$

Figure 6A:
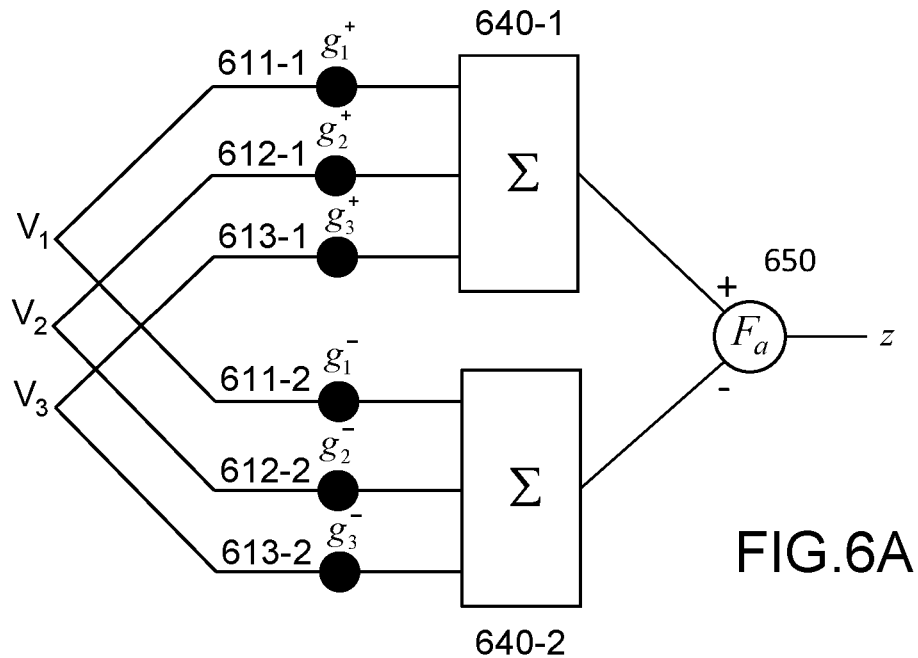
FIGS. 6A and 6B schematically illustrate a second variant of a neuron fed with synapses, which can be used in a BNN according the present invention.
Figure 6B:
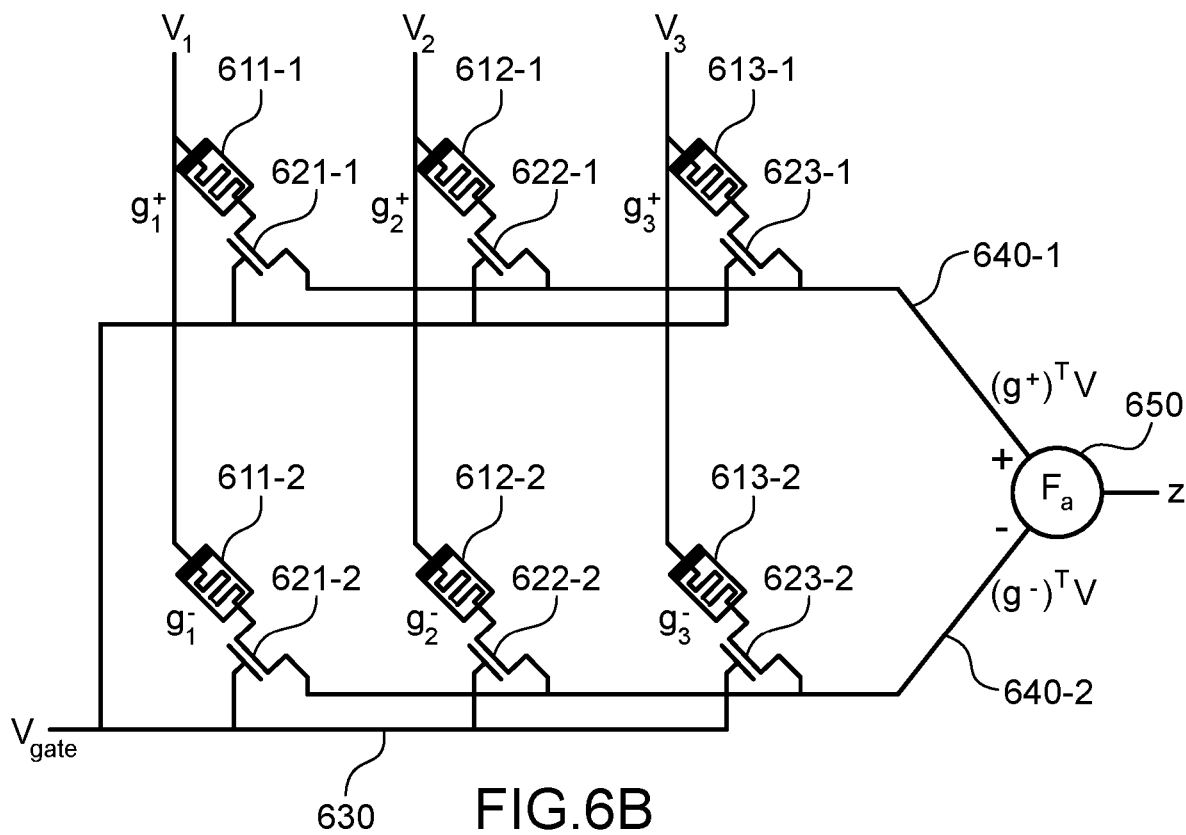

In practice, the synaptic coefficients can be positive or negative and therefore a differential configuration as illustrated in FIGS. 6A and 6B may be preferred.

FIG. 6A symbolically represents a second variant of a neuron fed with three synapses and FIG. 6B their corresponding implementation in a RRAM memory.

In this variant, each synapse is split into two branches according to a differential configuration. The first synapse is implemented by branches 611-1 and 611-2, branch 611-1 bearing a first branch coefficient, $g_1^+$, and branch 611-2 bearing a second branch coefficient, $g_1^-$. The second and third synapses have the same differential configuration. The outputs of the first branches are summed together in adder 640-1 and the outputs of the second branches are summed together in adder 640-2. The output of adder 640-1 is connected to a non-inverted input of neuron 650, whereas the output of adder 640-2 is connected to an inverted input thereof.

FIG. 6B shows the corresponding implementation in a RRAM. This RRAM differs from the one used in FIG. 5B by the fact that the synaptic coefficients are stored as pairs. More precisely, the vector of synaptic coefficients g, hereinafter referred to as synaptic vector, is represented by a pair $(g^+, g^-)$ with $g = g^+ - g^-$ where a first branch part, $g^+$, and the second branch part, $g^-$, of synaptic vector g are generated and stored separately in the RRAM. Expressed otherwise, a synapse is implemented by a cell comprising a first resistor storing the first branch coefficient, $g^+$, of the synapse and a second resistor storing the second branch, $g^-$, of the synapse.

As shown in FIG. 6B, each of the three cells embodying a synapse comprises a first resistor in series with a first FET transistor, and a second resistor in series with a second FET resistor. For example, the cell on the left comprises a first resistor 611-1 and a second resistor 611-2, a first FET transistor 621-1 in series with the first resistor, and a second FET transistor 621-2 in series with the second transistor.

The sources of the first FET transistors are connected to a first data line 640-1 and the drains of the second FET transistors are connected to a second data line 640-2. The first and second lines are respectively connected to a non-inverted input and an inverted input of the neuron 650. The neuron subtracts its inverted input to the non-inverted input and applies the activation function to the result thus obtained.

The gates of the first transistors and of the second transistors are all connected to the same control line 630.

Voltage $V_1$ is applied to both first resistor, 611-1, and second resistor, 611-2. Voltage $V_2$ is applied to both first resistor, 612-1, and second resistor, 612-2. Voltage $V_3$ is applied to both first resistor, 613-1, and second resistor, 613-2.

The conductance values of first resistors 611-1, 612-1, 613-1 are respectively equal to the first branch coefficients $g_1^+, g_2^+, g_3^+$ of the synapses whereas the conductance values of second transistors 611-2, 612-2, 613-2 are respectively equal to the second branch coefficients $g_1^-, g_2^-, g_3^-$.

The current flowing through first data line 640-1 is equal to the dot product $(g^+)^T V$ and the current flowing through second data line 640-2 is equal to the dot product $(g^-)^T V$. Hence, the output of neuron 650 can be expressed as:

$$z = F_a((g^+ - g^-)^T V) \qquad (8)$$

It may be necessary to add a bias to the dot product before applying the activation function, in which case expressions (7) and (8) respectively become:

$$z = F_a(g^T V + g_b V_b) \qquad (9)$$

$$z = F_a(g^+ - g^-)^T V + (g_b^+ - g_b^-) V_b) \qquad (10)$$

where $g_b, g_b^+, g_b^-$ are positive coefficients and $V_b$ is a predetermined bias voltage. However, the man skilled in the art will understand that expressions (9) and (10) can be regarded as particular cases of (7) and (8) by merely adding an additional synapse supplied with a bias voltage. Hence, without loss of generality, we may omit the constant and restrain our presentation to the purely linear configuration.

Figure 7A:
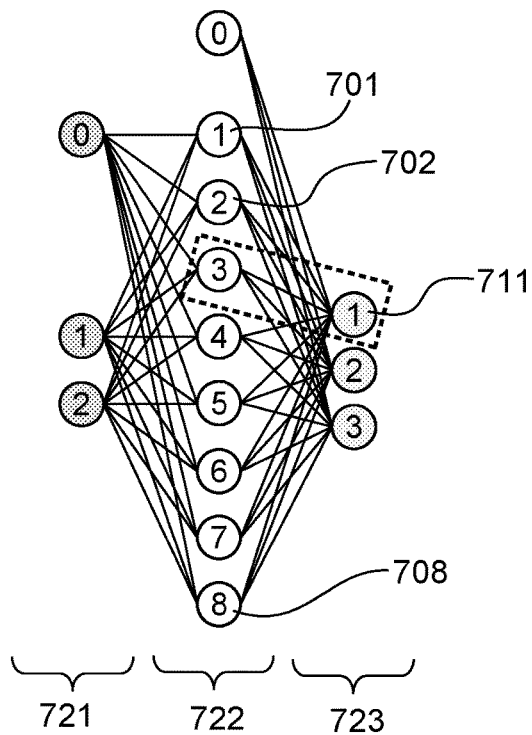
FIGS. 7A and 7B schematically illustrate an example of a BNN according to an embodiment of the present invention.
Figure 7B:
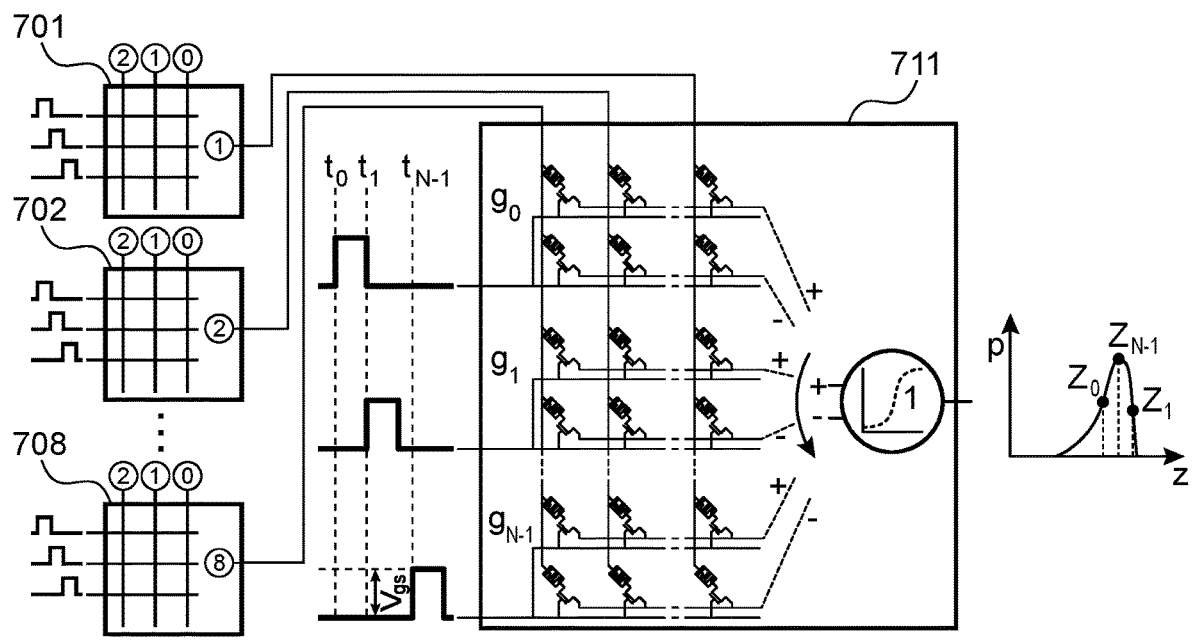

FIGS. 7A and 7B schematically illustrate the structure of an example of a BNN according to an embodiment of the present invention.

The BNN represented in FIG. 7A comprises three layers of neurons, each neuron of a layer being symbolically represented by a circle. Although the example shown comprise only one hidden, it will be understood by the man skilled in the art that several hidden layers can be provided between the input layer and the output layer. In other instances, e.g. in case the neural network is a perceptron, the hidden layer may be missing.

More specifically, in the present instance, two input neurons of the first layer, 721 feed forward into 8 neurons of a hidden layer, 722, which in turn feed forward into two neurons of the output layer, 723. Additional neurons labelled "0" in the first and the hidden layer provide constant values (bias voltage multiplied by a synaptic coefficient) as explained above in relation with expressions (9) and (10).

FIG. 7B schematically illustrates the details of the BNN of FIG. 7A. More specifically, the boxes 701, 702, 708 respectively correspond to neurons 1, 2, 8 of the hidden layer and box 711 corresponds to neuron 1 of the output layer. Each box shows a circuit implementing a neuron (represented by a circle) and a circuit implementing the synapses connected thereto (represented by an array of RRAM cells). In the present example, a differential configuration has been adopted, namely the second variant described in relation with FIGS. 6A-6B.

The structure of RRAM array is shown in detail for output neuron 511, it being understood that the same structure would be used for the other neurons.

In general, the RRAM array comprises a plurality N of rows, each row corresponding to an instance of the synapses connected to the neuron and having the structure already described in relation with the first variant of FIG. 5B or the second variant of FIG. 6B. Each row comprises P cells, each cell comprising a programmable resistor in the first variant (monopolar configuration) or a pair of programmable resistors in the second variant (differential configuration). In the latter configuration, the first programmable resistor of a cell represents the first branch and the second programmable resistor represents the second branch of the synapse.

The RRAM array comprises $P_i$ columns, each column representing a synapse, $P_i$ being the number of neurons of the preceding layer the neuron in question is connected to.

The different rows correspond to different samples of the joint posterior probability distribution of the synaptic coefficients. Assuming that the marginal posterior probability distribution of a synaptic coefficient q is decomposed by GMM into K Gaussian components of parameters $\tilde{\Omega}_q=\{\lambda_{q,k}, \mu_{q,k}|k=1, \ldots, K\}$, the number of cells in the column (corresponding to this synapse), programmed with the value $\mu_{q,k}$, will be proportional to $\lambda_{q,k} \cdot N$. By programming cells with the value $\mu_{q,k}$, we mean, in the first variant, that the resistors of the cells are programmed so that their respective conductance values $g_{q,k}$ follow a normal distribution of mean $\mu_{q,k}$.

In case of the second variant, we have two sets of parameters per synapse $\tilde{\Omega}_q^+=\{\lambda_{q,k}^+, \mu_{q,k}^+|k=1,\ldots,K\}$ and $\tilde{\Omega}_q^-=\{\lambda_{q,k}^-, \mu_{q,k}^-|k=1,\ldots,K\}$. By programming the cells, we mean, in the second variant, that the first resistors of the cells are programmed so that the respective conductance values of the first branches, $g_{k,q}^+$, follow a normal distribution of mean $\mu_{k,q}^+$ and that the respective conductance values of the second branches of these cells, $g_{k,q}^-$, follow a normal distribution of mean $\mu_{k,q}^-$.

If N is large enough, the set of conductance values of the resistors within the RRAM provides a fair representation of the posterior probability distribution p(w|D).

During inference, after the cells of the RRAM has been programmed, the N control lines of the array are selected in turn, e.g. by applying a sequence of pulses occurring at times $t_0, \ldots, t_{N-1}$ as shown. In other words, each neuron is switched sequentially between the N rows connected thereto.

When control line n is selected, while the voltage vector V is applied to the columns neuron outputs the value:

$$z_n = F_a(g_n^T V) \quad (11)$$

in the first variant, and $$z_n = F_a(g_n^+ - g_n^-)^T V) \quad (12)$$

in the second variant.

If the neuron belongs to the input layer or a hidden layer, the voltage output by the neuron, which is given by (11) or (12), propagates to the columns of the RRAM arrays of the next layer, according to the connection topology of the network.

If the neuron belongs to the output layer, the output of the neuron is stored in a memory. Hence, by sequentially switching the control lines of the RRAM arrays in the BNN and propagating the neuron outputs from a layer to the next throughout the BNN, we obtain a probability distribution, denoted p(z), if the output is scalar (e.g. in case of regression) or p(z) if the output is a vector (e.g. in case of classification). When a vector of data is applied to the input layer, a probability distribution of the inference from said vector of data is output by the output layer. This probability distribution can be used to make a prediction, for example by calculation the expectation of z on the probability distribution.

Figure 8:
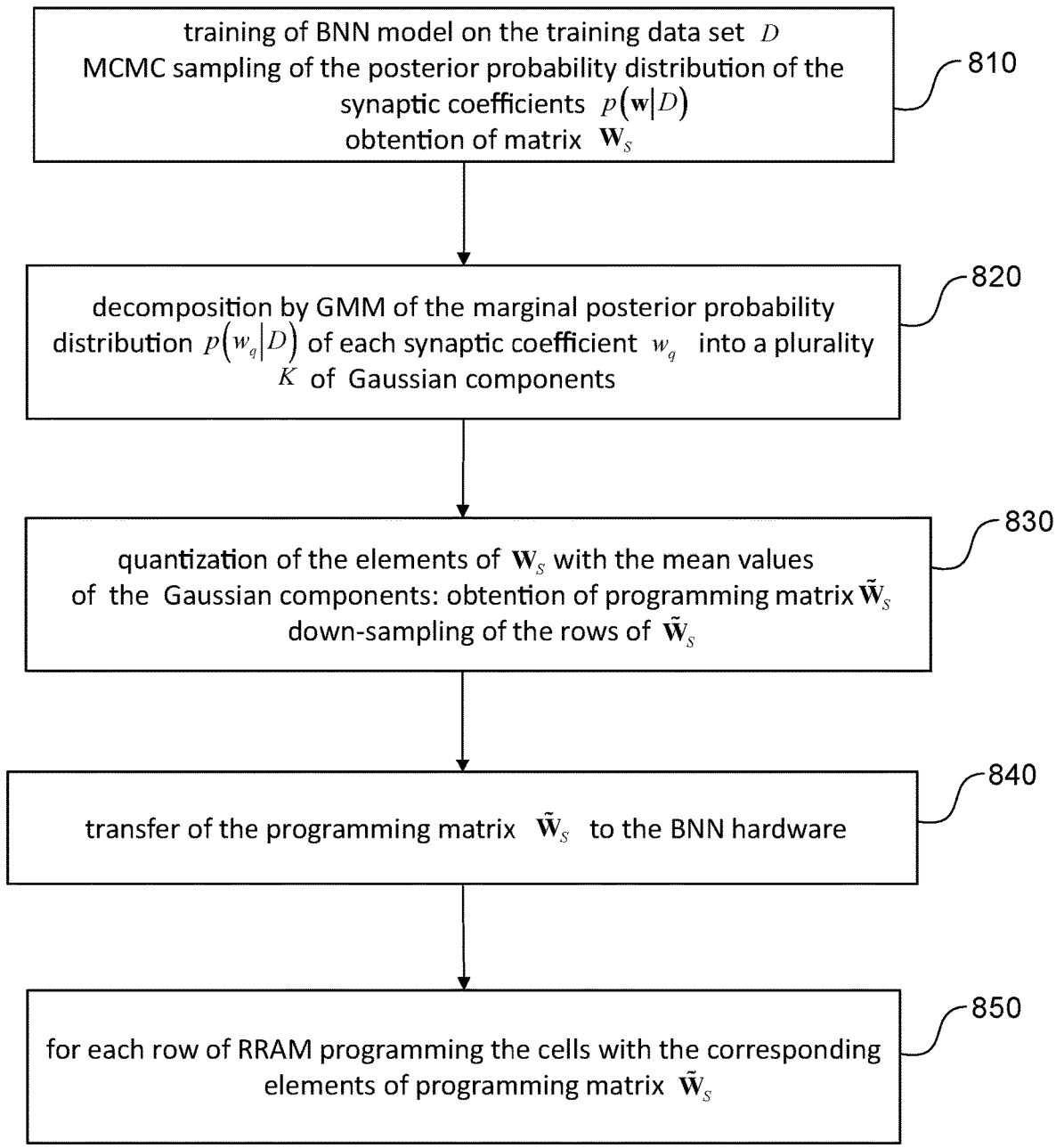
FIG. 8 schematically represents the flow chart of a method for programming a BNN according to a first embodiment of the present invention.

FIG. 8 schematically represents the flow chart of a method for programming a BNN according to a first embodiment of the present invention.

In a preliminary step, 810, the BNN model is trained on a training data set, D, and the posterior probability distribution of the synaptic coefficients p(w|D) is obtained by a MCMC method for example a No-U-Turn MCMC Sampling method as set out above. The prior probability distribution, p(w) is preferably chosen multivariate Gaussian of covariance matrix $\sigma_{init} I_Q$. In other words, the Q components are independent Gaussian random variables of identical mean value $\mu_{init}$ and identical standard deviation $\sigma_{init}$. Preferably, given the conductance range of the RRAM cells after a SET operation, the mean value $\mu_{init}$ is chosen equal to the middle value of the conductance range and the standard deviation is a fraction of the range width, for example half of this range.

The result of step 810 is a matrix $W_S$ of size S×Q, where S≥N is the number of samples of the probability distribution p(w|D), where Q is the number of synapses in the network. Each row of the matrix corresponds to an instance of the Q synaptic coefficients, or more precisely to a sample of the multivariate posterior probability distribution p(w|D).

At step 820, the marginal posterior probability distribution of each of the synaptic coefficients, $p(W_q|D)$, $q=1, \ldots, Q$ is decomposed by GMM into K Gaussian components by the EM (expectation-maximization) algorithm, the mean values and the standard deviations of the Gaussian components being constrained by the linear relationship (5) given by the RRAM cell characteristics. In practice, the marginal posterior probability distribution is provided by the samples $w_{s,q}$, $s=1, \ldots, S$, of the $q^{th}$ column of $W_S$.

This step provides a set of parameters $\tilde{\Omega}_q=\{\lambda_{q,k}, \mu_{q,k}|k=1, \ldots, K\}$ for each synaptic coefficient $w_q$, $q=1, \ldots, Q$ of the BNN, where $\mu_{q,k}, \lambda_{q,k}$ are respectively the median value and the weighting factor of the $k^{th}$ Gaussian component for synaptic coefficient $w_q$.

At step 830, the elements of the matrix $W_S$ are quantized by associating each element with the closest mean (or median) value among the K mean values of the respective K Gaussian components of the distribution it is stems from. More specifically, each element $w_{s,q}$ is associated with the quantized value:

$$\tilde{w}_{s,q} = \underset{\mu_{q,k}}{\mathrm{argmin}}(|w_{s,q} - \mu_{q,k}|) \quad (13)$$

In other words, the element $w_{s,q}$ is associated with the Gaussian component it most probably originates from. One can therefore form a programming matrix, $\tilde{W}_S$, the elements of which belong to the set $\{\mu_{q,k}|q=1,\ldots,Q, k=1,\ldots,K\}$ or more simply an index programming matrix $\tilde{\Gamma}_S$ of size S×Q whose elements are the indices $$\gamma_{s,q} = \underset{k}{\arg\min}(|w_{s,q} - \mu_{q,k}|) \qquad (14)$$

Optionally, if S>N the rows of programming matrix $\tilde{\Gamma}_S$ (or $\tilde{W}_S$) are subsampled so as to downsize the matrix to N×Q.

According to a variant, the subsampling step and the quantization step may be swapped.

At step 840, the programming matrix $\tilde{W}_S$ is transferred to the BNN network. Alternatively, the index programming matrix $\tilde{\Gamma}_S$ may be transferred along with the set of mean values $\{\mu_{q,k}|q=1,\ldots,Q, k=1,\ldots,K\}$ so as to reconstruct $\tilde{W}_S$ at the BNN side.

Steps 810 to 830 are typically performed by a distant server in the Cloud and then transferred at step 840 to the terminal (e.g. an IoT device) hosting the RRAM. However, in some instances, e.g. when the prediction/classification is provided as a service in the Cloud, the RRAM can be hosted by the server.

At step 850, for each row n of the RRAM, the cells embodying the synapses of the network are respectively programmed with the corresponding elements of matrix $\tilde{W}_S$, by applying the programming currents $$I_{SET}^{n,q} = \left(\frac{\tilde{w}_{n,q}}{\alpha}\right)^{1/\gamma}$$

during a SET operation.

The programming is carried out in turn for each row of the RRAM. It is important to note that the programmed conductance values of a row of cells correspond to the mean values in the corresponding row of matrix $\tilde{W}_S$, thereby capturing the correlation between the synaptic random variables.

Once the BNN has been programmed, it is ready to be used for inference by inputting a new vector of data to the network. The layers are processed sequentially, the voltages output by the neurons of a layer being simultaneously propagated to the next layer, or output if the layer is the output layer. For each neuron of a given layer, the N control lines controlling the different rows are switched in turn at switching instants, the voltage output by the neuron being propagated to the next layer at each switching instant.

After propagation of the voltages throughout the network, the neuron(s) of the output layer sequentially output(s) samples of z with the probability distribution p(z). These samples can be stored for later use, e.g. for calculation of an expectation value of z and, possibly, its standard variation which can provide a measure of uncertainty of the prediction.

Figure 9:
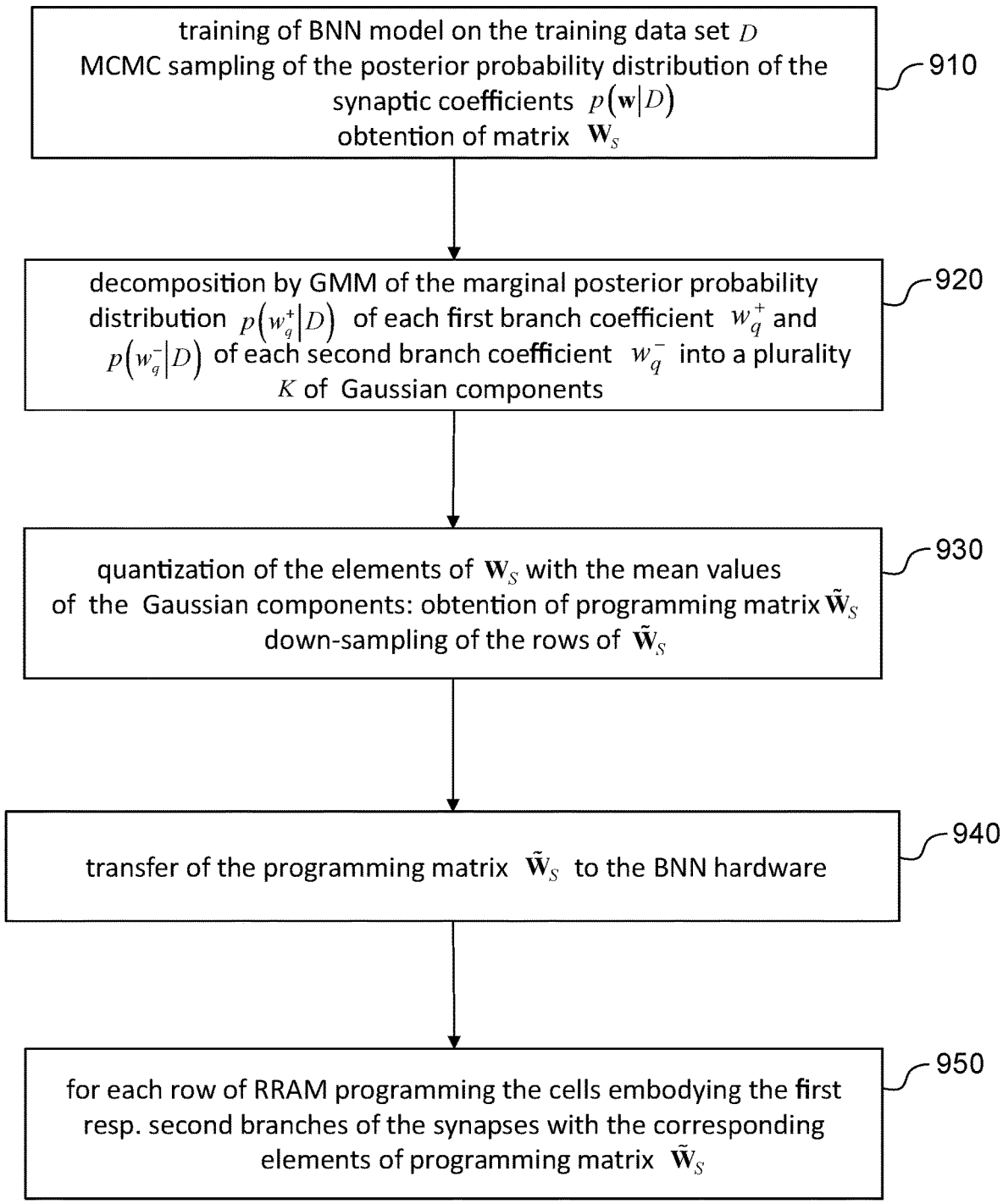
FIG. 9 schematically represents the flow chart of a method for programming a BNN according to a second embodiment of the present invention.

FIG. 9 schematically represents the flow chart of a method for programming a BNN according to a second embodiment of the present invention.

This embodiment differs from the first in that it aims at programming a BNN implemented according to a differential configuration, such as represented in FIGS. 6A and 6B. The BNN exhibit 2Q branch coefficients, each synapse being split into a first branch connected to the non-inverted input of a neuron and a second branch connected of inverted input of the same.

In a preliminary step, 910, the BNN model is trained on a training data set, D, and the posterior probability distribution of the synaptic coefficients p(w|D) is obtained by a MCMC method as explained for the first embodiment, where a synaptic coefficient, $w_q$, is to be understood here as entailing a first branch coefficient, $w_q^+$, and a second branch coefficient, $w_q^-$.

The result of step 910 is a matrix $W_S$ of size S×2Q, where S≥N is the number of samples of the probability distribution p(w|D), where Q is the number of synapses in the network. Each row of the matrix corresponds to an instance of the Q synaptic coefficients, or more precisely to a sample of the multivariate posterior probability distribution p(w|D).

At step 920, the marginal posterior probability distribution of each of the first branch coefficients, $p(w_q^+|D)$, q=1,...,Q and each of the second branch coefficients, $p(w_q^-|D)$, q=1,...,Q is decomposed by GMM into K Gaussian components by the EM (expectation-maximization) algorithm, the mean values and the standard deviations of the Gaussian components being constrained by the linear relationship (5) given by the RRAM cell characteristics.

This step provides a set of first parameters $\tilde{\Omega}_q^+ = \{\lambda_{q,k}^+, \mu_{q,k}^+|k=1,\ldots,K\}$ for each first branch coefficient $w_q^+$, q=1,...,Q of the BNN, where $\mu_{q,k}^+, \lambda_{q,k}^+$ are respectively the median value and the weighting factor of the $k^{th}$ Gaussian component for first branch coefficient $w_q^+$. Similarly, it provides a set of second parameters and $\tilde{\Omega}_q^- = \{\lambda_{q,k}^-, \mu_{q,k}^-|k=1,\ldots,K\}$ for each second branch coefficient $w_q^-$, q=1,...,Q of the BNN, where $\mu_{q,k}^-, \lambda_{q,k}^-$ are respectively the median value and the weighting factor of the $k^{th}$ Gaussian component for second branch coefficient $w_q^-$.

At step 930, the elements of matrix $W_S$ are quantized. More specifically, each (second) branch element $w_{s,q}^+$ ($w_{s,q}^-$) is associated with the quantized value:

$$\tilde{w}_{s,q}^+ = \underset{\mu_{q,k}^+}{\arg\min}(|w_{s,q}^+ - \mu_{q,k}^+|) \qquad (15-1)$$

and $$\tilde{w}_{s,q}^- = \underset{\mu_{q,k}^-}{\arg\min}(|w_{s,q}^- - \mu_{q,k}^-|) \qquad (15-2)$$

As in the first embodiment, if S>N, the rows of the resulting matrix $\tilde{W}_S$ are subsampled in order to downsize the matrix to N×2Q.

At step 940, the matrix $\tilde{W}_S$ is transferred to the BNN network. Alternatively, an index programming matrix $\tilde{\Gamma}_S$ of size N×2Q may be transferred along with both sets of mean values $\{\mu_{q,k}^+|q=1,\ldots,Q, k=1,\ldots,K\}$, $\{\mu_{q,k}^-|q=1,\ldots,Q, k=1,\ldots,K\}$ so as to reconstruct $\tilde{W}_S$ at the BNN side.

The variants envisaged for the first embodiment apply mutatis mutandis to the second embodiment.

At step 950, of each row n of the RRAM, the first, resp. second resistor, in a cell of this row, respectively embodying the first, resp. the second branch of the synapse associated with said cell, are programmed with the corresponding elements of matrix $\tilde{W}_S$, by applying the respective programming currents $$I_{SET}^{+n,q} = \left(\frac{\tilde{w}_{n,q}^+}{\alpha}\right)^{1/\gamma}, I_{SET}^{-n,q} = \left(\frac{\tilde{w}_{n,q}^-}{\alpha}\right)^{1/\gamma}$$

during a SET operation.

The programming is carried out in turn for each row of the RRAM. It is important to note that the programmed conductance values of a row of cells correspond to the mean values in the corresponding row of matrix $\tilde{W}_S$, thereby capturing the correlation between the synaptic random variables.

Once the BNN has been programmed, it is ready to be used for inference by inputting a new vector of data to the network as in the first embodiment.

Figure 10:
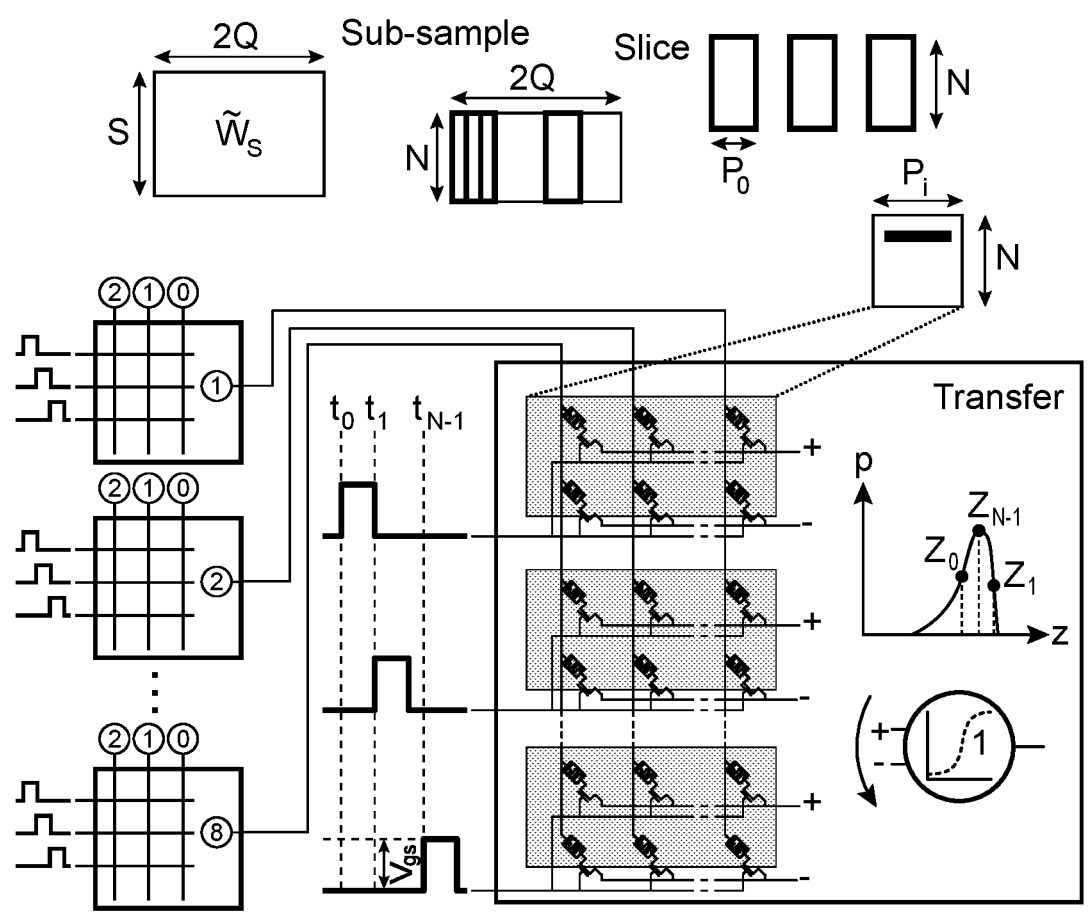
FIG. 10 illustrates the transfer of a programming matrix for programming the RRAM memory used in FIG. 9.

FIG. 10 illustrates the transfer of the programming matrix $\tilde{W}_S$ to the BNN for programming the RRAM memory.

The same part of the BNN as in FIG. 7B has been reproduced.

The original $\tilde{W}_S$ matrix is represented in 1010 with its original size, S×2Q, and in 1020, after down-sampling, with size N×2Q. The matrix is then sliced into slices $P_i$, i=1, . . . , I where I is the number of neurons, a slice $P_i$ corresponding to (the first and second branches of) the synapses connected to the $i^{th}$ neuron.

More specifically, the first transistors of the $n^{th}$ row cells of the RRAM array, embodying the first branches of the synapses connected to the $i^{th}$ neuron are respectively programmed with the $\tilde{w}_{n,q}^+$ values present in the $n^{th}$ row of slice whereas the second transistors of the $n^{th}$ row cells of the RRAM array, embodying the second branches of these synapses are programmed with the $\tilde{w}_{n,q}^-$ values present in the same row of the same slice.

By using a row of the $\tilde{W}_S$ matrix to program an instance of the first and second branch coefficients of all the synapses, the correlation between the branch random variables is preserved.

Figure 11:
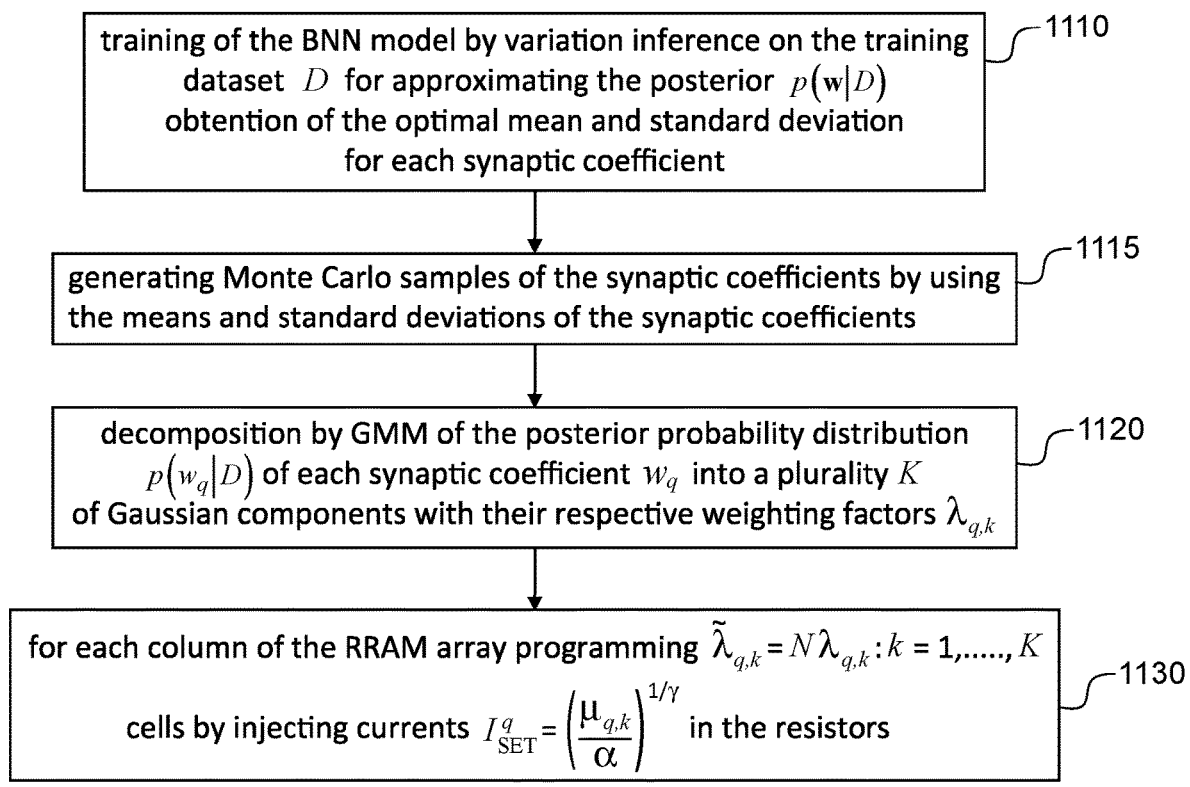
FIG. 11 schematically represents the flow chart of a method for programming a BNN according to a third embodiment of the present invention.

FIG. 11 schematically represents the flow chart of a method for programming a BNN according to a third embodiment of the present invention.

The third embodiment differs from the first embodiment in that the posterior probability distribution of the synaptic coefficients p(w|D) is not obtained by a MCMC method but is approximated by an analytic distribution, known as variational density, q(w; ϕ) depending upon a set of parameters denoted ϕ. This method, known as variational inference or VI, has been described in the article of A. Kucukelbir et al. entitled "Automatic Differentiation Variational Inference" published in Journal of Machine Learning Research, No. 18, 2017, pp. 1-45 and also in the article of C. Blundell et al. entitled "Weight uncertainty in neural network" published in Proc. of the $32^{nd}$ Int'l Conference on Machine Learning, Lille, France, 2015, vol. 17. Examples of VI methods are mean-field VI or automatic differentiation VI, known as ADVI. For the sake of simplification, but without prejudice of generalization, the description will be limited to ADVI.

The optimal set of parameters, $\phi_{opt}$ can be determined by minimizing the Kullback-Leibler divergence between the posterior probability distribution p(w|D) and the variational density, q(w, ϕ). As this problem is generally intractable, ADVI proposes to maximize equivalently the so-called evidence lower bound (ELBO) of the parameters ϕ, ELBO (ϕ), where:

$$ELBO(\phi) = E_{q(w;\phi)}[\log p(D, w) - \log q(w; \phi)] \quad (16)$$

$$\text{and } \phi_{opt} = \arg\max_{\phi}[ELBO(\phi)].$$

The variational density can be chosen as a multinomial Gaussian distribution whereby each synapse is defined by a mean and a standard deviation. The synapses are assumed to be independent and therefore their parameters do not co-vary. The ELBO value can be calculated through Monte Carlo integration by random sampling the current parameters of the variational density.

The optimal set of parameters, $\phi_{opt}$, can be obtained by stochastic gradient descent, also known as automatic differentiation.

At step 1110, once the BNN has been trained by variational inference (e.g. ADVI), the variational density q(w, $\phi_{opt}$) is known and hence the respective means and standard deviations of the synaptic coefficients.

At step 1115, samples of the synaptic coefficients are generated with Monte Carlo sampling, by using their respective means and standard deviations.

The posterior distribution of samples of each synaptic coefficient is then decomposed in 1120 by GMM into a plurality of Gaussian components, by using the expectation-maximization algorithm, the mean values and the standard deviations of the Gaussian components being constrained by the linear relationship (5) given by the RRAM cell characteristics. As in step 820, this step provides a set of parameters $\tilde{\Omega}_q = \{\lambda_{q,k}, \mu_{q,k} | k=1, \ldots, K\}$ for each synaptic coefficient $w_q$, q=1, . . . , Q of the BNN, where $\mu_{q,k}, \lambda_{q,k}$ are respectively the median value and the weighting factor of the $k^{th}$ Gaussian component for synaptic coefficient $w_q$.

At step 1130, for each synaptic coefficient $w_q$, $\tilde{\lambda}_{q,k} = \lfloor N \lambda_{q,k} \rfloor$, k=1, . . . , K resistors of a column of the RRAM cells are programmed by injecting a current $$I_{SET}^q \left( \frac{\mu_{q,k}}{\alpha} \right)^{1/\gamma}$$

corresponding to median value $\mu_{q,k}$ during a SET operation, where N is the number of RRAM cells used for implementing the synapse. More generally, $\tilde{\lambda}_{q,k}$ is the integer value closest to N $\lambda_{q,k}$. By contrast with the first embodiment, it should be noted that there is no need here to program the RRAM row by row in order to retain the dependence between the synaptic coefficients. It suffices to program the RRAM by column while complying the number $\lambda_{q,k}$ of RRAM cells programmed with a current corresponding to mean value, $\mu_{q,k}$.

Figure 12:
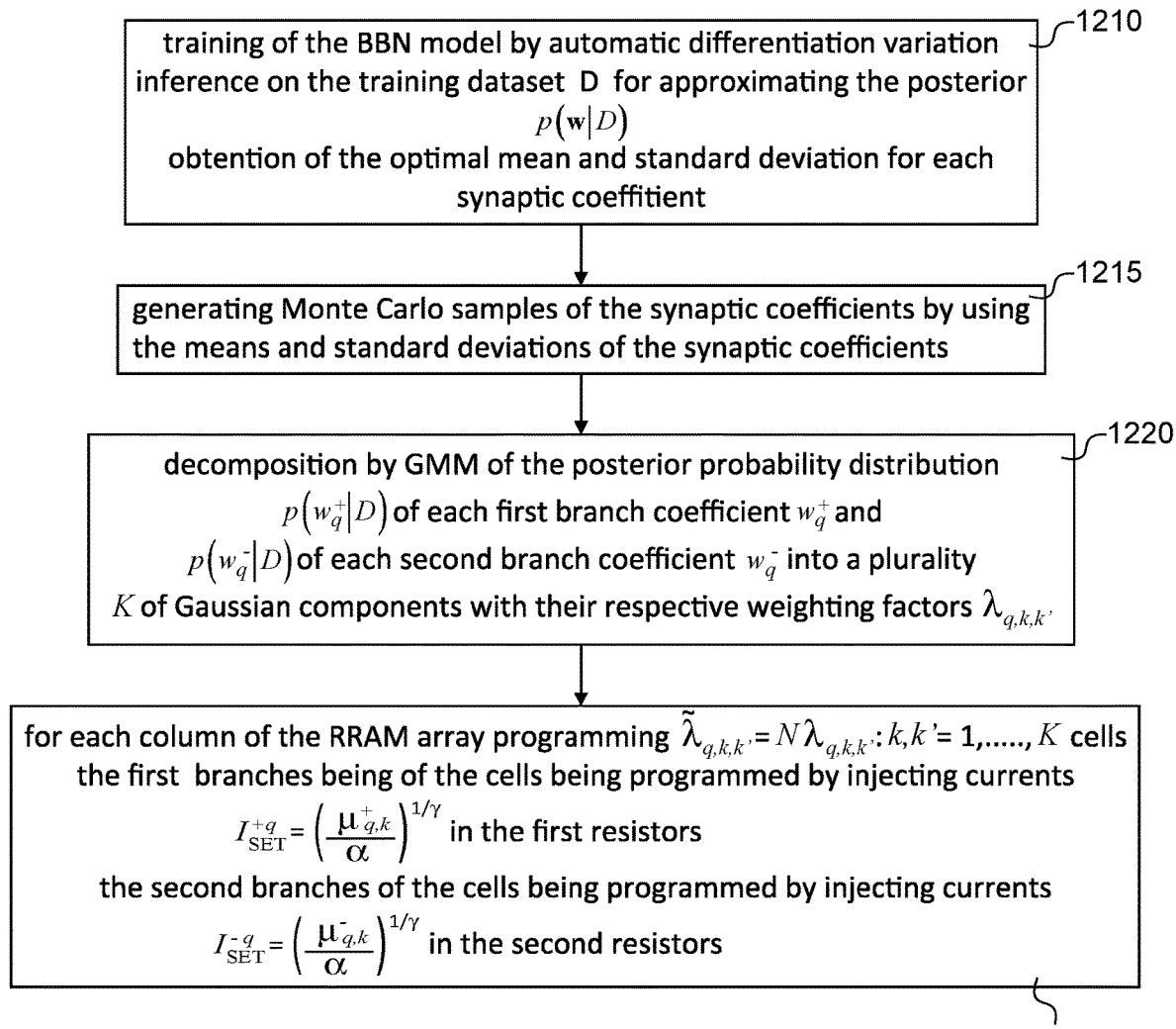
FIG. 12 schematically represents the flow chart of a method for programming a BNN according to a fourth embodiment of the present invention.

FIG. 12 schematically represents the flow chart of a method for programming a BNN according to a fourth embodiment of the present invention.

The fourth embodiment differs from the second embodiment in that the BNN is trained by using variational inference while it differs from the third embodiment in that it aims at programming a BNN according to a differential configuration.

More specifically, in step 1210, as in step 1110, the BNN is trained by VI (e.g. ADVI) for approximating the posterior probability distribution p(w|D) by a variational density, q(w, ϕ). However, here each synaptic coefficient, $w_q$, is to be understood here as entailing a first branch coefficient, $w_q^+$, and a second branch coefficient, $w_q^-$, as explained in relation with FIGS. 9 and 10. This step allows to obtain a couple of optimal means and standard deviations for the first and second branches of each synaptic coefficient.

At step 1215, samples of the synaptic coefficients, i.e. 2S samples of the first branch and second branch coefficients are generated by Monte Carlo sampling by using the couples of means and standard deviations obtained at the preceding step.

At step 1220, the posterior distribution of samples of each synaptic coefficient is then decomposed by GMM into a plurality of Gaussian components, by using the expectation-maximization algorithm, thereby providing couples of branch synaptic coefficients $w_{q,k}^+$, $w_{q,k}^-$, each couple of Gaussian components k,k' being weighted by a weighting factor $\lambda_{q,k,k'}$.

At step 1230, for each couple of branch synaptic coefficients, $w_{q,k}^+$, $w_{q,k'}^-$, the first branch resistor of the RRAM cell is programmed with a current $$I_{SET}^{+q}\left(\frac{\tilde{w}_{q,k}^+}{\alpha}\right)^{1/\gamma}$$

corresponding to median value $\mu_{q,k}^+$ and the second branch resistor of the RRAM cell is programmed with a current $$I_{SET}^{-q} = \left(\frac{\tilde{w}_{q,k'}^-}{\alpha}\right)^{1/\gamma}$$

corresponding to $\mu_{q,k}^-$.

By contrast with the second embodiment, it should be noted that there is no need here to program the RRAM row by row in order to retain the dependence between the branch synaptic coefficients. It suffices to program the RRAM cells by column while complying with the number $\tilde{\lambda}_{q,k,k'} = \lfloor \lambda_{q,k,k'} N \rfloor$ of couples of synaptic branches respectively programmed with the couples of currents $I_{SET}^{+q}$, $I_{SET}^{-q}$ corresponding to the couple of mean values, $\mu_{q,k}^+$, $\mu_{q,k'}^-$. More generally, $\tilde{\lambda}_{q,k,k'}$ is the integer value closest to $\lambda_{q,k,k'} N$.

The man skilled in the art will understand that the first and second embodiments have been described in the context of modelling a posterior probability distribution of synaptic coefficients by MCMC, the third and fourth embodiments have been described in the context of modelling a posterior probability distribution of synaptic coefficients by VI. It should be noted though, that alternative algorithms can be used for modelling the posterior probability distribution of the synaptic coefficients during the training of the BNN without going out the scope of the present invention.

The invention claimed is:

1. A method for programming a Bayesian neural network comprising an input layer and an output layer, each neuron of a layer being fed with a plurality of synapses, wherein said plurality of synapses are implemented as a RRAM array of cells being organized into columns and rows, each column of the RRAM array being associated with a synapse, each row of the array corresponding to a sample of a posterior probability of synaptic coefficients after the neural network has been trained, each cell comprising at least a first resistor in series with a first transistor, drains of the first transistors of the cells of a row in the array being connected together with an input of a neuron, gates of the first transistors of a row being connected together with a control line, the control lines connecting the gates of the first transistors of the N rows being configured to be switched in turn, voltages output by all the neurons of a layer being simultaneously propagated to a next, or being output if the layer is the output layer, successive voltages output by output layer providing a probability distribution (p(z)) of an inference from a vector of data when said vector of data is input to the input layer, said method comprising:

(a) training a model of the Bayesian neural network on a training dataset, D, a posterior probability distribution of the synaptic coefficients p(w|D) of the network being sampled by a Markov Chain Monte Carlo (MCMC) algorithm, thereby providing a matrix $W_S$ of size S×Q, each row of said matrix corresponding to a sample of the synaptic coefficients and each column of said matrix corresponding to a synapse of said network;

(b) decomposing a marginal posterior probability distribution of each synaptic coefficient, $w_q$ into a plurality K of Gaussian components, the $k^{th}$ Gaussian component of synaptic coefficient $w_q$ having a median value $\mu_{q,k}$;

(c) transforming each sample of a synaptic coefficient, $w_q$, in matrix $W_S$ into a quantized value to obtain a programming matrix $\tilde{W}_S$, said quantized value being selected as a mean value of a Gaussian component obtained at step (b) which is closest to said sample of synaptic coefficient; and (d) programming the first resistors of each row, n, of the RRAM array, by injecting therein a current of intensity $$I_{SET}^{n,q} = \left(\frac{\tilde{w}_{n,q}}{\alpha}\right)^{1/\gamma}$$

during a SET operation, where $\tilde{w}_{n,q}$ is an element at row n and column q of programming matrix $W_S$ and $\alpha$, $\gamma$ are coefficients characteristic of the RRAM array.

2. The method for programming a Bayesian neural network according to claim 1 wherein, in step (a), a posterior probability distribution of the synaptic coefficients is obtained by a No-U-Turn MCMC sampling method.

3. The method for programming a Bayesian neural network according to claim 1, wherein the number S of rows in matrix $W_S$ is higher than the number N of rows in the RRAM array, and the rows of matrix $W_S$ are subsampled, prior or after step (c) so as to only retain N rows thereof.

4. The method for programming a Bayesian neural network according to claim 1, wherein the K Gaussian components of a synaptic coefficient, $w_q$, are obtained by an expectation-maximization (EM) algorithm, the respective median values, $\mu_{q,k}$, and standard deviations, $\sigma_{q,k}$, k=1, ..., K of said Gaussian components being considered as latent variables bound by a linear constraint $\sigma_{q,k} = \sigma_0 - \lambda \cdot \mu_{q,k}$ where $\sigma_0$ and $\lambda$ are constant values characteristic of the RRAM array.

5. The method for programming a Bayesian neural network according to claim 1, wherein steps (a), (b) and (c) are carried out by a distant server in the Cloud and the programming matrix $\tilde{W}_S$ is transferred to the RRAM array to program the first resistors in step (d), said RRAM array being hosted by a mobile terminal or an IoT device.

6. A method for programming a Bayesian neural network comprising an input layer and an output layer, each neuron of a layer being fed with a plurality of synapses, wherein said plurality of synapses are implemented as a RRAM array of cells being organized into columns and rows, each column of the RRAM array being associated with a synapse, each row of the array corresponding to a sample of a posterior probability of synaptic coefficients after the neural network has been trained, each cell comprising at least a first resistor in series with a first transistor, drains of the first transistors of the cells of a row in the array being connected together with an input of a neuron, gates of the first transistors of a row being connected together with a control line, the control lines connecting the gates of the first transistors of the N rows being configured to be switched in turn, voltages output by all the neurons of a layer being simultaneously propagated to a next, or being output if the layer is the output layer, successive voltages output by output layer providing a probability distribution (p(z)) of an inference from a vector of data when said vector of data is input to the input layer; each cell of the RRAM array further comprising a second resistor in series with a second transistor, gates of the second transistors of a row being connected together with the control line connected to the gates of the first transistors of said row, the drains of the first transistors of the cells of a row being connected together with a non-inverted input of said neuron and drains of the second transistors of the cells of a row being connected together with an inverted input of said neuron, said method comprising:

(a) training a model of the Bayesian neural network on a training dataset, D, each synapse of the neural network having a first branch and a second branch, said first branch comprising the first resistor and the first transistor of a cell, said second branch comprising the second resistor and the second transistor of said cell, a posterior probability distribution of the synaptic coefficients p(w|D) of the network being obtained by a Markov Chain Monte Carlo (MCMC) algorithm, each synaptic coefficient entailing a first branch coefficient and a second branch coefficient, thereby providing a matrix $W_S$ of size S×2Q, each row of said matrix corresponding to a sample of the synaptic coefficients and each column of said matrix corresponding to a synapse;

(b) decomposing a marginal posterior probability distribution of each first, resp. second branch coefficient into a plurality K of Gaussian components, the $k^{th}$ Gaussian component of said first, resp. second branch coefficient $w_q^+$, resp. $w_q^-$, having a median value $\mu_{q,k}^+$, resp. $\mu_{q,k}^-$; and (c) transforming each sample of a first, resp. second branch coefficient, $w_q^+$, resp. $w_q^-$ in matrix $W_S$ into a quantized value to obtain a programming matrix $\tilde{W}_S$, said quantized value being selected as a mean value of a Gaussian component obtained at step (b) which is closest to said sample of first, resp. second branch coefficient;

(d) programming the first, resp. second resistors of each row, n, of the RRAM array, by injecting therein a first current of intensity $$I_{SET}^{+n,q} = \left(\frac{\tilde{w}_{n,q}^+}{\alpha}\right)^{1/\gamma},$$

resp. a second current of intensity $$I_{SET}^{-n,q} = \left(\frac{\tilde{w}_{n,q}^-}{\alpha}\right)^{1/\gamma}$$

during a SET operation, where $\tilde{w}_{n,q}^+, \tilde{w}_{n,q}^-$ are elements related to synapse q at row n of programming matrix $W_S$ and α, γ are coefficients characteristic of the RRAM array.

7. The method for programming a Bayesian neural network according to claim 6 wherein, in step (a), the posterior probability distribution of the first and second branch of the synaptic coefficients is obtained by a No-U-Turn MCMC sampling method.

8. The method for programming a Bayesian neural network according to claim 6, wherein the number S of rows in matrix $W_S$ is higher than the number N of rows in the RRAM array, and the rows of matrix $W_S$ are subsampled, prior or after step (c) so as to only retain N rows thereof.

9. The method for programming a Bayesian neural network according to claim 6, wherein the K Gaussian components of a first, resp. second branch coefficient, $w_q^+$, resp. $w_q^-$, are obtained by an expectation-maximization (EM) algorithm, the respective median values, $\mu_{q,k}^+$, $\mu_{q,k}^-$, and standard deviations, $\sigma q_{ik}^+$, $\sigma_{q,k}^-$, k=1, ..., K of said Gaussian components being considered as latent variables bound by linear constraints $\sigma_{q,k}^+ = \sigma_0 - \lambda \cdot \mu_{q,k}^+$ and $\sigma_{q,k}^- = \sigma_0 - \lambda \cdot \mu_{q,k}^-$ where $\sigma_0$ and $\lambda$ are constant values characteristic of the RRAM array.

10. The method for programming a Bayesian neural network according to claim 6, wherein steps (a), (b) and (c) are carried out by a distant server in the Cloud and the programming matrix $W_S$ is transferred to the RRAM array to program the first resistors in step (d), said RRAM array being hosted by a mobile terminal or an IoT device.

11. A method for programming a Bayesian neural network comprising an input layer and an output layer, each neuron of a layer being fed with a plurality of synapses, wherein said plurality of synapses are implemented as a RRAM array of cells being organized into columns and rows, each column of the RRAM array being associated with a synapse, each row of the array corresponding to a sample of a posterior probability of synaptic coefficients after the neural network has been trained, each cell comprising at least a first resistor in series with a first transistor, drains of the first transistors of the cells of a row in the array being connected together with an input of a neuron, gates of the first transistors of a row being connected together with a control line, the control lines connecting the gates of the first transistors of the N rows being configured to be switched in turn, voltages output by all the neurons of a layer being simultaneously propagated to a next, or being output if the layer is the output layer, successive voltages output by output layer providing a probability distribution (p(z)) of an inference from a vector of data when said vector of data is input to the input layer, said method comprising:

(a) a model of the Bayesian neural network is trained on a training dataset, D, a posterior probability distribution of the synaptic coefficients p(w|D) of the network being approximated by an analytic density distribution by variational inference on the dataset, thereby providing a mean and a standard deviation for each synaptic coefficient;

(b) samples of the synaptic coefficients are generated by Monte Carlo sampling of the analytic density distribution by using the mean and standard deviation obtained for each synaptic coefficient at step (a);

(c) a posterior probability distribution represented by the samples of each synaptic coefficient, $w_q$ is decomposed into a plurality K of Gaussian components, the $k^{th}$ Gaussian component of synaptic coefficient $w_q$ having a mean value $\mu_{q,k}$ and a weighting factor $\lambda_{q,k}$; and (d) programming, for each synaptic coefficient, $w_q$, and each $k^{th}$ Gaussian component, $\tilde{\lambda}_{q,k}$ first resistors of a column of the RRAM array, by injecting therein a current of intensity $$I_{SET}^q = \left(\frac{\mu_{q,k}}{\alpha}\right)^{1/\gamma}$$

during a SET operation, where α, γ are coefficients characteristic of the RRAM array, N is the number of first resistors of the RRAM array implementing said synaptic coefficient, and $\tilde{\lambda}_{q,k}$ is the integer value closest to $N\lambda_{q,k}$.

12. A method for programming a Bayesian neural network comprising an input layer and an output layer, each neuron of a layer being fed with a plurality of synapses, wherein said plurality of synapses are implemented as a RRAM array of cells being organized into columns and rows, each column of the RRAM array being associated with a synapse, each row of the array corresponding to a sample of a posterior probability of synaptic coefficients after the neural network has been trained, each cell comprising at least a first resistor in series with a first transistor, drains of the first transistors of the cells of a row in the array being connected together with an input of a neuron, gates of the first transistors of a row being connected together with a control line, the control lines connecting the gates of the first transistors of the N rows being configured to be switched in turn, voltages output by all the neurons of a layer being simultaneously propagated to a next, or being output if the layer is the output layer, successive voltages output by output layer providing a probability distribution (p(z)) of an inference from a vector of data when said vector of data is input to the input layer, each cell of the RRAM array further comprising a second resistor in series with a second transistor, gates of the second transistors of a row being connected together with the control line connected to the gates of the first transistors of said row, the drains of the first transistors of the cells of a row being connected together with a non-inverted input of said neuron and drains of the second transistors of the cells of a row being connected together with an inverted input of said neuron
said method comprising:
(a) a model of the Bayesian neural network is trained on a training dataset, D, a posterior probability distribution of the synaptic coefficients p(w|D) of the network being approximated by an analytic density distribution by variational inference on the dataset, each synaptic coefficient entailing a first branch coefficient and a second branch coefficient, said training providing a mean and a standard deviation for each synaptic branch coefficient;
(b) samples of the synaptic branch coefficients are generated by Monte Carlo sampling of the analytic density distribution by using the mean and standard deviation obtained for each synaptic branch coefficient at step (a);
(c) a posterior probability distribution of each first, resp. second branch coefficient is decomposed into a plurality K of Gaussian components, the $k^{th}$ Gaussian component of said first, resp. second branch coefficient $w_q^+$, resp. $w_q^-$, having a mean value $\mu_{q,k}^+$, resp. $\mu_{q,k}^-$, and each couple of Gaussian components, k, k' having a weighting factor $\lambda_{q,k,k'}$; and
(d) programming, for each couple of synaptic branch coefficients, ($w_q^+$, $w_q^-$), and each couple of Gaussian components, k,k', $\tilde{\lambda}_{q,k,k'}$ first and second resistors of a column of the RRAM array, by injecting therein a first current of intensity $$I_{SET}^{+q} = \left(\frac{\mu_{q,k}^+}{\alpha}\right)^{1/\gamma},$$

resp. a second current of intensity $$I_{SET}^{-q} = \left(\frac{\mu_{q,k'}^-}{\alpha}\right)^{1/\gamma}$$

during a SET operation, where α, γ are coefficients characteristic of the RRAM array, N being number of couples of first resistor and second resistors of the RRAM array implementing said couple of synaptic branch coefficients, and $\tilde{\lambda}_{q,k,k'}$ being the integer value closest to $\lambda_{q,k,k'}N$.

* * * * *